United States Patent
Yamadai

[19]

[11] Patent Number: 6,083,830
[45] Date of Patent: Jul. 4, 2000

[54] PROCESS FOR MANUFACTURING A SEMICONDUCTOR DEVICE

[75] Inventor: Tsutomu Yamadai, Fukuyama, Japan

[73] Assignee: Sharp Kabushiki Kaisha, Osaka, Japan

[21] Appl. No.: 09/192,437

[22] Filed: Nov. 16, 1998

[30] Foreign Application Priority Data

Dec. 25, 1997 [JP] Japan .................................. 9-356479

[51] Int. Cl.⁷ ...................... H01L 21/768; H01L 21/3205
[52] U.S. Cl. ........................ 438/653; 438/656; 438/685; 438/688; 438/785; 438/973; 438/648; 257/915; 257/763; 257/764; 257/767
[58] Field of Search .................... 438/648, 685, 438/688, 656, 652, 653, 785, 973; 257/764, 767, 763, 915

[56] References Cited

U.S. PATENT DOCUMENTS

| | | | |
|---|---|---|---|
| 5,523,259 | 6/1996 | Merchant et al. .................. | 438/643 |
| 5,580,823 | 12/1996 | Hegde et al. ...................... | 438/648 |
| 5,627,102 | 5/1997 | Shinriki et al. ..................... | 438/643 |
| 5,652,464 | 7/1997 | Liao et al. ......................... | 257/915 |
| 5,776,831 | 7/1998 | Padmanabhan et al. ........... | 438/688 |

FOREIGN PATENT DOCUMENTS

| | | | |
|---|---|---|---|
| 741949 | 2/1995 | Japan ................................. | 438/656 |
| 07099193 | 11/1995 | Japan . | |
| 7297380 | 11/1995 | Japan ................................. | 438/664 |

*Primary Examiner*—Mary Wilczewski
*Assistant Examiner*—Yung A. Lin
*Attorney, Agent, or Firm*—Nixon & Vanderhye, P.C.

[57] ABSTRACT

A process for producing a semiconductor device comprising the steps of forming a titanium film having a (002) orientation, forming a titanium nitride film on the titanium film to such a thickness as allows the titanium nitride film to follow the orientation of the titanium film, and forming an aluminum alloy film on the titanium nitride film, thereby to form a layer structure for wiring including the aluminum alloy film having a (111) orientation.

6 Claims, 2 Drawing Sheets

PROCESS FOR MANUFACTURING A SEMICONDUCTOR DEVICE

CROSS-REFERENCE TO RELATED APPLICATION

This application is related to Japanese patent application No. HEI 9(1997)-356479, filed on Dec. 25, 1997, whose priority is claimed under 35 USC § 119, the disclosure of which is incorporated by reference in its entirety.

BACKGROUND OF THE INVENTION

1. Field of the Invention

The present invention relates to a process for manufacturing a semiconductor device, especially a process for manufacturing a semiconductor device including the formation of a layer of an aluminum (Al) alloy layer for wiring.

2. Description of Related Art

In recent years, the dominating technology for forming wires of LSIs is to form a film of Al/Cu or Al/Si/Cu on a titanium nitride (TiN), titanium (Ti) film or a multilayer of TiN and Ti films as a barrier metal and then forming a TiN film on the top thereof which serves as an antireflection film at photolithography.

Where the TiN and Ti films are layered for use as the barrier metals for the Al alloy, the TiN film is typically 500 to 1000 Å thick for obtaining practical characteristics of barrier metals, and the TiN film have the orientation of (111) in most cases.

The TiN film and Ti films as the barrier metal are known to be effective for increasing the life of a device against electromigration (hereinafter referred to as EM). The reason is that the TiN and Ti films allow the Al alloy film to develop in the orientation of (111) and have a preventing effect on interface diffusion of the Al alloy, which is a cause of EM disconnection.

It is known that Cu in the Al alloy film separates as an intermetallic compound in a grain boundary of an aluminum polycrystalline film, passivates the grain boundary, reduces voids in the grain boundary and prevents grain boundary diffusion, and thus have effect of improving resistance to EM.

In the layer structure of the Al alloy film, TiN film and Ti film arranged in this order from the top, it is proposed to form the antireflection film on the top of the layer structure at a temperature of 150° C. or lower thereby to improve the EM resistance (Japanese Unexamined Patent Publication No. Hei 7(1995)-99193).

These Ti film and TiN films as the barrier metal are generally formed by a DC magnetron reactive sputtering method, and the TiN film as the antireflection film is formed by a reactive sputtering method wherein the sputtering is performed using a Ti target in an atmosphere of nitrogen. The Ti film, TiN film, Al alloy film and the TiN film serving as the antireflection film thereon are all formed continuously in a single apparatus and then patterned by usual photolithography and dry etching using a reactive ion etching (RIE) technique.

Here, Ti and TiN are usually sputtered under the following conditions: at a pressure of about 2 to 15 mTorr, at a DC power of about 2 to 8 kW, in a chamber for sputtering at a temperature from room temperature to about 300° C. and in an atmosphere of argon. Al/Cu or Al/Si/Cu is usually sputtered under the following conditions: at a pressure of about 5 to 20 mTorr, at a DC power of about 5 to 15 kW, in the chamber for sputtering at a temperature from about 100 to 250° C. and in an atmosphere of argon.

The EM resistance is known to be more excellent as the Al alloy is more highly oriented in a (111) orientation. In order to produce an Al alloy film highly oriented in (111), it is necessary to consider the orientation of a layer (i.e., the barrier metal) under the Al alloy film. As described above, the layer under the Al alloy film is a Ti film or a TiN film in most cases currently. From comparison of Ti and TiN films, it has been found that an Al alloy film more highly oriented in (111) is obtained by placing a Ti film having a (002) orientation immediately under the Al alloy film because of lattice constant. Actually, it has been found that the EM resistance is more improved by placing the Ti film than by placing the TiN film, as an underlayer of the Al alloy film.

However, in the viewpoint of patterning, it has been found that, in the case where the Ti film is used as the layer under the Al/Cu or Al/Si/Cu film, which is typically used as the Al alloy film, fine holes (of about 0.2 μm diameter) appear on sidewalls of wires of the Al alloy during making the Al alloy film into wires, more particularly, during the dry etching using the RIE technique.

In other words, the Al alloy wires are usually formed through the photolithography and the dry etching using the RIE technique. In the case where the Ti film is used immediately under the Al alloy to which Cu is added such as Al/Cu, fine holes (of about 0.2 μm diameter) are open on the sidewalls of the wires after the dry etching (these holes are referred to as side-holes hereinafter). As a result, the reliability of the wires declines.

In order to prevent the generation of the side-holes, a selectivity of a resist at the etching for forming the wires of the Al alloy can be lowered for the purpose of positively forming deposits on the sidewalls of the Al alloy film for protection of the sidewalls. However, this method cannot be applicable to devices having large steps, and therefore, is not an essential side-hole prevention.

On the other hand, it has been found that the TiN film immediately under the Al alloy film have effect of preventing the generation of side-holes. In this case, on the other hand, the EM resistance declines.

SUMMARY OF THE INVENTION

The present invention provides a process for producing a semiconductor device comprising the steps of forming a Ti film having a (002) orientation, forming a TiN film on the Ti film to such a thickness as allows the TiN film to follow the orientation of the Ti film, and forming an Al alloy film on the TiN film, thereby to form a layer structure for wiring including the aluminum alloy film having a (111) orientation.

In other words, the present invention provides a method for manufacturing a semiconductor device. The method includes forming a wire structure capable of preventing the generation of side-holes, which would otherwise appear after the formation of wires of an Al alloy, and retarding the deterioration of EM resistance.

DESCRIPTION OF THE PREFERRED EMBODIMENTS

Figure 1A:
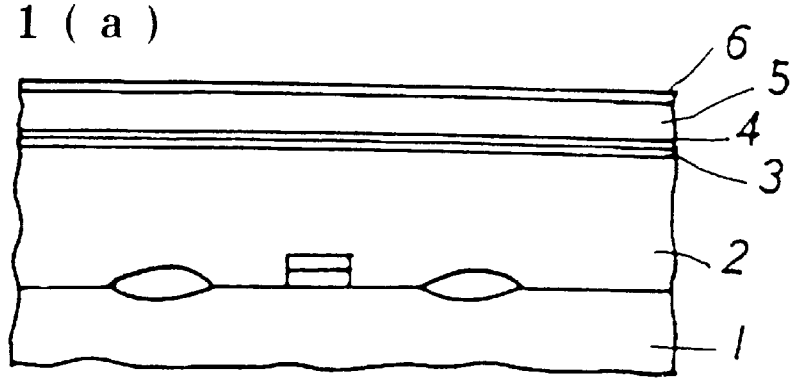
FIGS. 1(a) to 1(c) are schematic sectional views of a principal part illustrating a process for manufacturing a semiconductor device in accordance with the present invention.

The present invention mainly comprises the formation of layers for wiring including sequential formation of a Ti film, a TiN film and an Al alloy film.

In the present invention, these layers for wiring are typically formed on a semiconductor substrate. Materials for the semiconductor are not particularly limited, but include semiconductors such as silicon and germanium, and compound semiconductors such as GaAs and InGaAs. The semiconductor substrate may usually have semiconductor elements such as transistors or capacitors, an insulating film, a wire layer, a layer insulating film or a combination thereof formed thereon. Immediately under the Ti film, an insulating film or a layer insulating film is preferably formed.

In the present invention, a Ti film is first formed to have the (002) orientation substantially. Provided that the Ti film has the above orientation, the Ti film may be formed by any method. Among these methods, the DC magnetron reactive sputtering method using a titanium target is preferable. The Ti film may be formed by the DC magnetron reactive sputtering at a pressure of about 2 to 5 mTorr at a DC power of about 1 to 3 kW at a substrate temperature of about 25 to 300° C. As a carrier gas, an inert gas such as helium, argon may be used at about 50 to 200 sccm. The thickness of the Ti film may be varied as required depending on the size of the semiconductor device to be produced, voltages to be applied or the like, but is preferably about 500 to 1,500 Å, for example.

Next, a TiN film is formed on the Ti film to such a thickness that the TiN film can follow the orientation of the Ti film formed just under the TiN film. Here the phase "following the orientation of the Ti film" means that the orientation of the TiN film maintains the (002) orientation substantially. For example, the thickness of the TiN film may be about 50 to 500 Å, preferably 50 to 300 Å, more preferably 200 to 300 Å. Provided that the TiN film have such a thickness that the film can maintain the above-described orientation, the TiN film may be formed by any method, for example, by any of the methods listed above for the formation of the Ti film. Among the methods, the DC magnetron reactive sputtering method using a titanium target is preferable. The TiN film may be formed by the DC magnetron reactive sputtering method at a pressure of about 3 to 8 mTorr at a DC power of about 3 to 8 kW at a substrate temperature of about 25 to 300° C. while introducing a nitrogen gas at a flow rate of about 50 to 300 sccm. As a carrier gas, an inert gas such as helium or argon may be used at about 10 to 80 sccm.

Subsequently, an Al alloy film is formed on the TiN film. Examples of Al alloy films include Al/Cu, AlSiCu and a multilayer of two or more thereof. The thickness of the Al alloy film is preferably about 3,000 to 1000 Å. The Al alloy film may be formed by any of the methods listed above for the formation of the Ti film, among which the DC magnetron reactive sputtering method using a Al/Cu or AlSiCu target is preferable. The Al alloy film may be formed by the DC magnetron reactive sputtering method at a pressure of about 2 to 5 mTorr at a DC power of about 7 to 13 kW at a substrate temperature of about 100 to 250° C. As a carrier gas, an inert gas such as helium, argon or nitrogen may be used at about 10 to 80 sccm.

By forming the Al alloy film as described above, the obtained Al alloy film has the (111) orientation substantially.

Additionally, in the present invention, a TiN film or a multilayer of two or more thereof may be formed as an antireflection film on the Al alloy film. The antireflection film may be formed by any of the above-listed methods. The thickness of the antireflection film may be about 200 to 1500 Å.

Further, in the present invention, after the sequential formation of the Ti film, TiN film, Al alloy film and, optionally, the antireflection film, these films may be patterned into a desired configuration by a usual method, for example, by photolithography and etching.

Figure 1B:
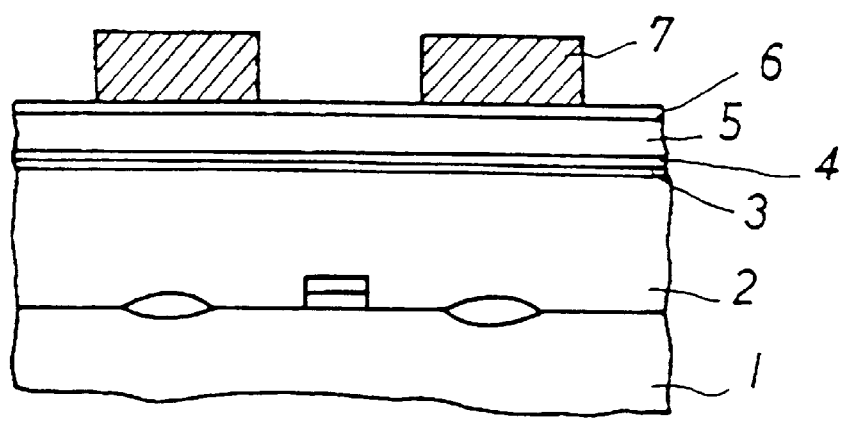
Figure 1C:
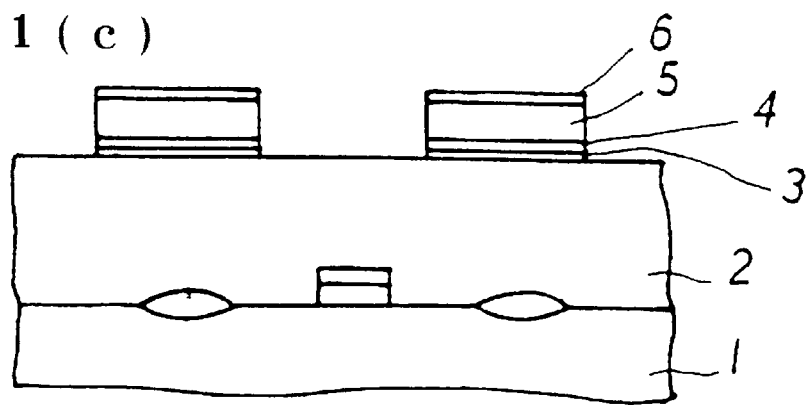

Now, an exemplary process for producing a semiconductor device in accordance with the present invention is explained by reference to FIGS. 1(a) to 1(c).

First, a layer insulating film, e.g., a BPSG film 2, is deposited on a silicon substrate 1 having transistors or the like formed thereon by using a CVD method. Then, a Ti film 3 is formed to a thickness of about 500 to 1,500 Å on the layer insulating film by a usual DC magnetron reactive sputtering method under the conditions of a pressure of 2 to 5 mTorr, a DC power of 1 to 3 kW and a flow rate of argon of 80 to 100 sccm.

Then, subsequently in the same apparatus, a TiN film 4 is formed to a thickness of about 50 Å or more and about 300 Å or less under the conditions of a pressure of 3 to 8 mTorr, a DC power of 3 to 8 kW, a flow rate of nitrogen of 100 to 150 sccm and a flow rate of argon of 20 to 40 sccm, without being exposed to air.

Further, an Al/Cu alloy film 5 is subsequently formed to a thickness of about 3,000 to 10,000 Å under the conditions of a pressure of 2 to 5 mTorr, a DC power of 7 to 13 kW and a flow rate of argon of 20 to 50 sccm.

On the top thereof, a TiN film 6 is formed as an antireflection film at photolithography by the sputtering method as the above-described TiN film 4 is formed.

Thus, the layer structure for wiring is formed in which the TiN film is formed just under the Al/Cu alloy film and the Ti film is formed just under the TiN film. Further, since the TiN film follows the (002) orientation of the lowermost Ti film, the Al/Cu alloy film can be highly oriented in the (111) orientation.

Then, a resist 7 is applied and patterned by a photolithography technique. Subsequently, the already formed TiN/Al/ Cu/TiN/Ti films are etched by the RIE technique, and lastly, the resist 7 is removed. Thereby metal wires are formed. This formation of the metal wires can prevent the generation of side-holes on sidewalls of the Al/Cu alloy film during the dry-etching using the RIE technique for forming wires in the layer structure for wiring which includes the Al/Cu alloy film.

In substantially the same manner as in the above-described example, an Al/TiN/Ti film was formed to have a thickness of 4,000 Å/300 Å/200 Å under the conditions shown in the following table 1. For comparison, another Al/TiN/Ti film was formed to have a thickness of 4,000 Å/1,000 Å/200 Å.

TABLE 1

|  | Layer Structure | Thickness (Å) | Ti Sputter Temperature |
|---|---|---|---|
| Example | AlCu/TiN/Ti | 4000/300/200 | 300° C. |
| Comparative Example | AlCu/TiN/Ti | 4000/1000/200 | 300° C. |

Figure 2:
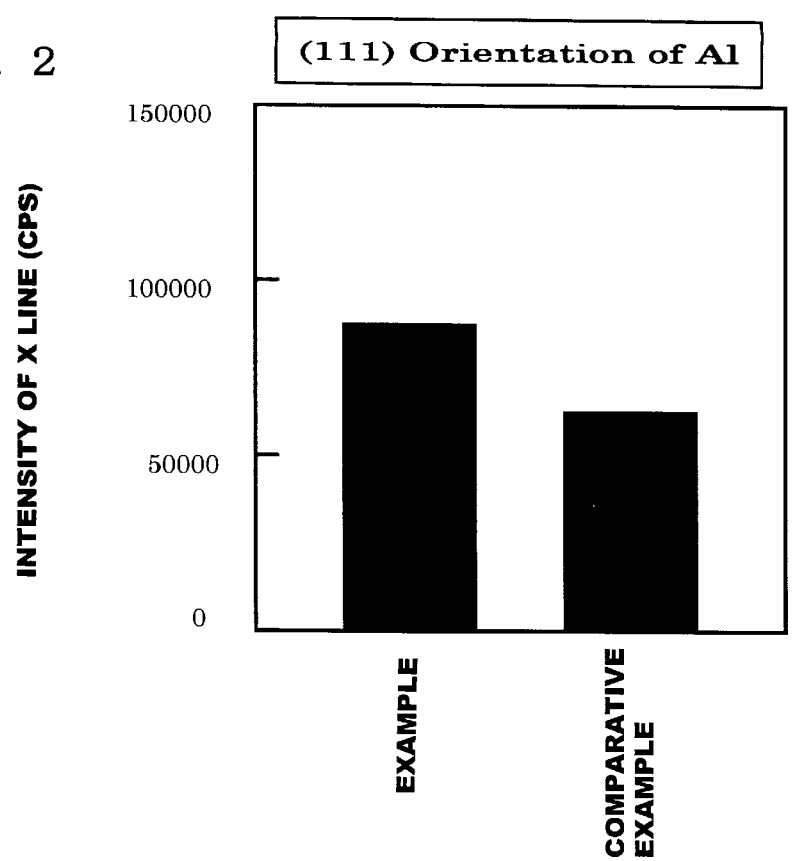
FIG. 2 is a graph showing X-ray intensities of the (111) orientation of the Al film in accordance with the present invention.
Figure 3:
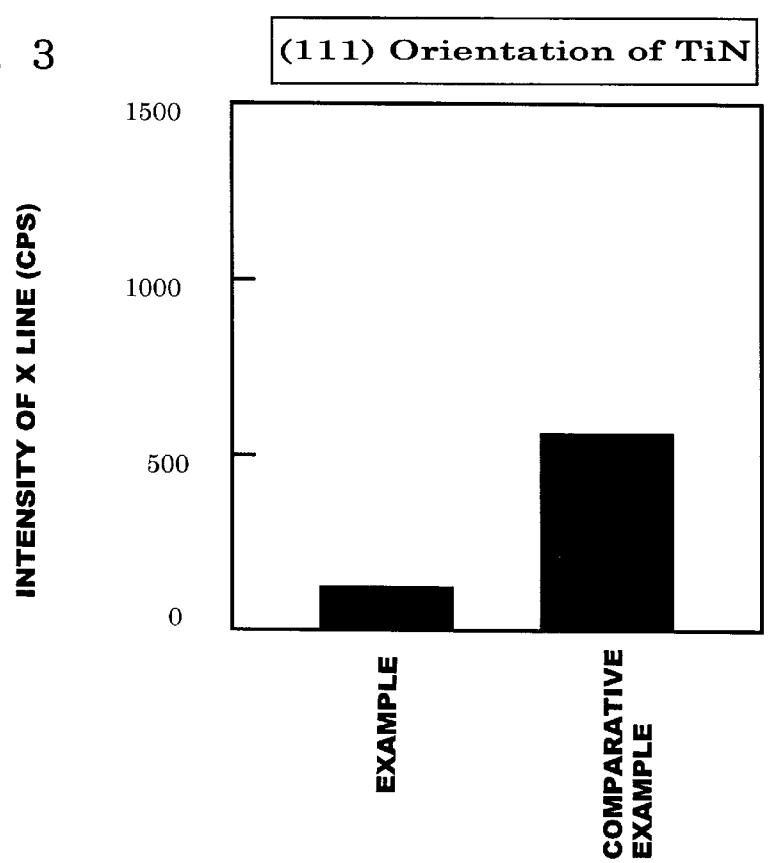
FIG. 3 is a graph showing X-ray intensities of the (111) orientation of the TiN film in accordance with the present invention.

FIG. 2 and FIG. 3 show X-ray intensities of the (111) orientation of the Al film and that of the TiN film in the obtained layer structures.

FIGS. 2 and 3 show that, in the case where the TiN film was as thick as 10,00 Å, the peak of the (111) orientation of the TiN film was higher compared with the case where the TiN film was thin as the present invention. On the other hand, the peak of the (111) orientation of the Al film was higher where the TiN film was thin as in the present invention compared with the case where the TiN film was as thick as 1,000 Å. In other words, in the present invention, the thin TiN film followed the (002) orientation of the underlying Ti film positively. Thus the peak of the (111) orientation of the TiN film became lower and the peak of the (111) orientation of Al film became higher.

According to the present invention, by making the thickness of the TiN film such as allows the TiN film to maintain the orientation of the Ti film (thickness is about 50 to 300 Å), the TiN film can develop to substantially follow the (002) orientation of the Ti film under the TiN film. Therefore, the upper Al alloy film such as an Al/Cu film is more highly oriented in the (111) orientation, compared with the case where the TiN film has a thickness more than 300 Å. The thinner TiN film tends to facikitate in the (111) orientation of the Al/Cu film formed thereon. For these reasons, a higher EM resistance can be obtained.

Furthermore, the TiN film of 50 Å or more in thickness formed just under the Al/Cu alloy film can prevent the generation of side-holes on sidewalls of the Al/Cu alloy film during the dry etching by the RIE technique for forming the wires of the layer structure including the Al/Cu alloy film. It has been found that, if the TiN film is not used just under the Al/Cu alloy film, for example, if a Ti film is used, side-holes are generated on sidewalls of the Al/Cu alloy film during the etching by the RIE technique for forming wires.

From the above, the TiN film of 50 to 300 Å thick just under the Al/Cu alloy film and the Ti film under the TiN film can prevent the generation of side-holes and improve the electromigration resistance or the like for improved reliability of the semiconductor device.

What is claimed is:

1. A process for producing a semiconductor device comprising the steps of:

forming a titanium film having a (002) orientation;

forming a titanium nitride film on the titanium film to such a thickness as allows the titanium nitride film to follow the orientation of the titanium film; and forming an aluminum alloy film on the titanium nitride film, thereby to form a layer structure for wiring including the aluminum alloy film having a (111) orientation.

2. The process according to claim 1, wherein the titanium nitride film has a thickness of 50 to 300 Å.

3. The process according to claim 1, wherein the titanium film is formed by a DC magnetron reactive sputtering method.

4. The process according to claim 1, wherein the titanium nitride film is formed by a DC magnetron reactive sputtering method.

5. The process according to claim 1, wherein the aluminum alloy film is an Al/Cu film or an AlSiCu film.

6. The process according to claim 1, wherein the aluminum alloy film is formed by a DC magnetron reactive sputtering method.

* * * * *